(12) United States Patent
Smith

(10) Patent No.: US 9,337,369 B2
(45) Date of Patent: May 10, 2016

(54) SOLAR CELLS WITH TUNNEL DIELECTRICS

(71) Applicant: David D. Smith, Campbell, CA (US)

(72) Inventor: David D. Smith, Campbell, CA (US)

(73) Assignee: SunPower Corporation, San Jose, CA (US)

(*) Notice: Subject to any disclaimer, the term of this patent is extended or adjusted under 35 U.S.C. 154(b) by 228 days.

(21) Appl. No.: 14/229,769

(22) Filed: Mar. 28, 2014

(65) Prior Publication Data

US 2015/0280031 A1    Oct. 1, 2015

(51) Int. Cl.
*H01L 21/00* (2006.01)
*H01L 31/00* (2006.01)
*H01L 31/0368* (2006.01)
*H01L 31/068* (2012.01)

(52) U.S. Cl.
CPC ........ *H01L 31/03682* (2013.01); *H01L 31/068* (2013.01)

(58) Field of Classification Search
CPC .............. H01L 31/068; H01L 31/0682; H01L 31/0684; H01L 31/02167; H01L 31/02008
USPC .............................. 438/98; 136/252, 256, 258
See application file for complete search history.

(56) References Cited

U.S. PATENT DOCUMENTS

| 8,697,553 B2* | 4/2014 | Adibi | ..................... H01L 21/266 136/256 |
| 2004/0261834 A1* | 12/2004 | Basore | ............ H01L 31/022425 136/244 |
| 2008/0299297 A1* | 12/2008 | Cousins | ............ H01L 21/76802 427/74 |
| 2010/0229928 A1* | 9/2010 | Zuniga | .............. H01L 31/03921 136/255 |

FOREIGN PATENT DOCUMENTS

WO    WO 2009/094578    7/2009

OTHER PUBLICATIONS

J. Robertson, "High dielectric constant oxides," Eur. Phys. J. Appl. Phys. vol. 28, pp. 265-291 (2004).

* cited by examiner

*Primary Examiner* — Kevin M Picardat
(74) *Attorney, Agent, or Firm* — Blakely Sokoloff Taylor Zafman LLP

(57) ABSTRACT

A solar cell can have a first dielectric formed over a first doped region of a silicon substrate. The solar cell can have a second dielectric formed over a second doped region of the silicon substrate, where the first dielectric is a different type of dielectric than the second dielectric. A doped semiconductor can be formed over the first and second dielectric. A positive-type metal and a negative-type metal can be formed over the doped semiconductor.

20 Claims, 5 Drawing Sheets

| # | Dielectric Compounds | Band Gap (eV) | Electron Barrier (eV) | Hole Barrier (eV) |
|---|---|---|---|---|
| 1 | Silicon Dioxide ($SiO_2$) | 9 | 3.2 | 4.7 |
| 2 | Silicon Nitride ($Si_3N_4$) | 5.3 | 2.4 | 1.8 |
| 3 | Aluminium Oxide ($Al_2O_3$) | 8.8 | 2.8 | 4.9 |
| 4 | Titanium Oxide ($Ta_2O_5$) | 4.4 | 0.35 | 2.95 |
| 5 | Titanium Dioxide ($TiO_2$) | 3.5 | 0 | 2.4 |

*FIG. 1*

SOLAR CELLS WITH TUNNEL DIELECTRICS

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit.

Efficiency is an important characteristic of a solar cell as it is directly related to the solar cell's capability to generate power. Accordingly, techniques for improving the fabrication process, reducing the cost of manufacturing and increasing the efficiency of solar cells are generally desirable. Such techniques can include forming improved contact regions of solar cells to increase electrical conduction and solar cell efficiency.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 illustrates a table of sample dielectric compounds, according to some embodiments.

DETAILED DESCRIPTION

Figure 2:
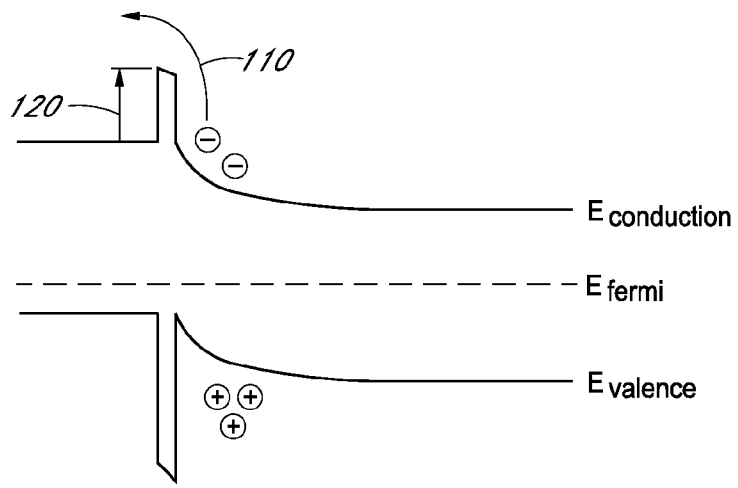
FIG. 2 illustrates a sample energy level diagram, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" dielectric does not necessarily imply that this dielectric is the first dielectric in a sequence; instead the term "first" is used to differentiate this dielectric from another dielectric (e.g., a "second" dielectric).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification first describes example data and illustrations which support the formation of improved dielectrics for contact regions of a solar cell, followed by a description of an example solar cell. A more detailed explanation of various embodiments of the example solar cell is provided throughout.

In an embodiment, a dielectric can be formed at the interface between a doped semiconductor, such as doped polysilicon or doped amorphous silicon, and a silicon substrate of the solar cell. Benefits of forming a dielectric between a doped semiconductor and a silicon substrate of a solar cell can be increased electrical conduction. Benefits can also include increased solar cell efficiency. In some embodiments, the doped semiconductor can also be referred to as a wide band gap doped semiconductor. In an embodiment, the doped semiconductor can be a P-type doped semiconductor or an N-type doped semiconductor. Similarly, the P-type doped semiconductor can be a P-type doped polysilicon or a P-type doped amorphous silicon. Also, the N-type doped semiconductor can be a N-type doped polysilicon or a N-type doped amorphous silicon. In an embodiment, the dielectric can be referred to as a tunnel dielectric. The solar cell can also include an N-type silicon or a P-type silicon substrate.

Turning now to FIG. 1 there is shown a table listing sample dielectric compounds formed on a silicon substrate and their corresponding properties: Band Gap (eV), Electron Barrier (eV) and Hole Barrier (eV), according to some embodiments. For a N-type doped semiconductor on a silicon substrate, it can be beneficial to increase the electron conduction by choosing a dielectric compound formed in-between the N-type doped semiconductor and the silicon substrate which increases electron conduction and reduces hole conduction (e.g., electron barrier<hole barrier). Referring to FIG. 1, one such dielectric is silicon dioxide. In contrast, for a P-type doped semiconductor on a silicon substrate, it can be beneficial to increase the hole conduction through the P-type contact by choosing a dielectric compound formed in-between the P-type doped semiconductor and the silicon substrate which increases hole conduction and reduces electron conduction (e.g., electron barrier>hole barrier). As shown, one such dielectric is silicon nitride.

Figure 3:
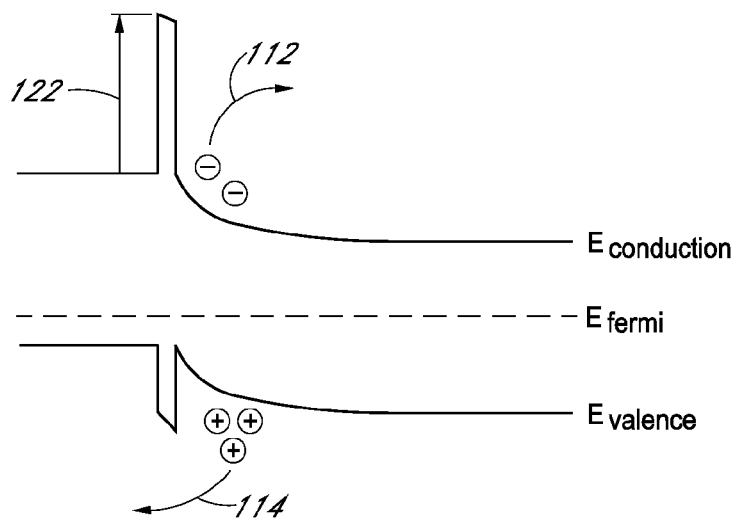
FIG. 3 illustrates another sample energy level diagram according to some embodiments.
Figure 4:
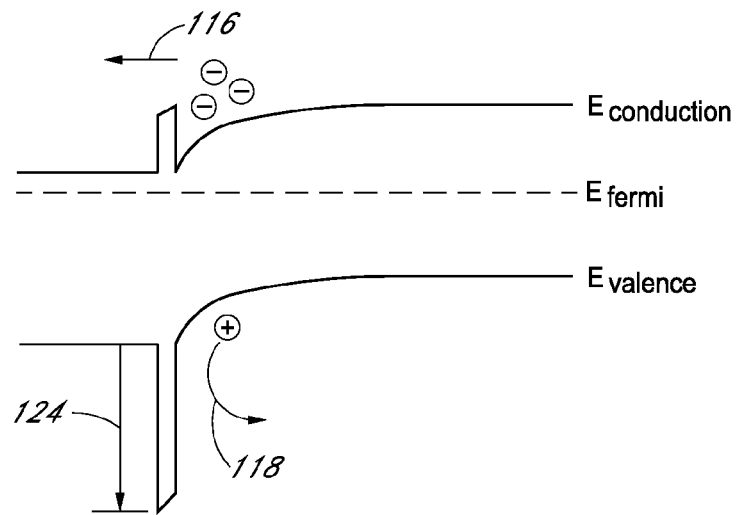
FIG. 4 illustrates still another sample energy level diagram according to some embodiments.

FIGS. 2-4 show various example energy level diagrams for dielectrics formed in-between a doped semiconductor and silicon substrate.

FIG. 2 illustrates an example energy level diagram of silicon dioxide formed in-between a P-type doped semiconductor and a silicon substrate. As shown, for silicon dioxide the electron barrier 120 along the conduction band is low enough (e.g., electron barrier<hole barrier) to allow electrons to pass 110 while blocking holes on the valence band. For this configuration, such as a P-type doped semiconductor on a silicon substrate, electrical conduction can be increased by allowing more holes to pass and to block electrons.

With reference to FIG. 3, there is shown an energy level diagram of silicon nitride formed in-between a P-type doped semiconductor on a silicon substrate. In contrast to FIG. 2, the electron barrier 122 is high enough (e.g., electron barrier>hole barrier) to block electrons from passing 112 while allowing 114 holes to pass on the valence band. Benefits of this configuration can include increased electrical conduction.

FIG. 4 illustrates an energy level diagram of silicon dioxide formed in-between an N-type doped semiconductor and a silicon substrate. As shown, the electron barrier along the conduction band is low enough (e.g., electron barrier<hole barrier) to allow electrons to pass 116 while the hole barrier 124 is high along the valence band blocking holes 118 from passing. Benefits of this configuration can include increased electrical conduction.

Various dielectric compounds formed in-between P-type doped semiconductors on silicon substrates can be used such that the electron barrier for the dielectric compound is greater than the hole barrier (e.g., electron barrier>hole barrier). One example of such a dielectric compound is silicon nitride. Similarly, various dielectric compounds formed in-between N-type doped semiconductors on silicon substrates can be used such that the electron barrier for the dielectric compound is less than the hole barrier (e.g., electron barrier<hole barrier). One example of such a dielectric compound is silicon dioxide. A benefit for using a dielectric with an electron barrier less than a hole barrier for a dielectric formed in-between a N-type doped semiconductor and a silicon substrate can be to increase electrical conduction. Similarly, a benefit for using a dielectric with an electron barrier greater than a hole barrier for a dielectric formed in-between a P-type doped semiconductor and a silicon substrate can be to increase electrical conduction.

Figure 5:
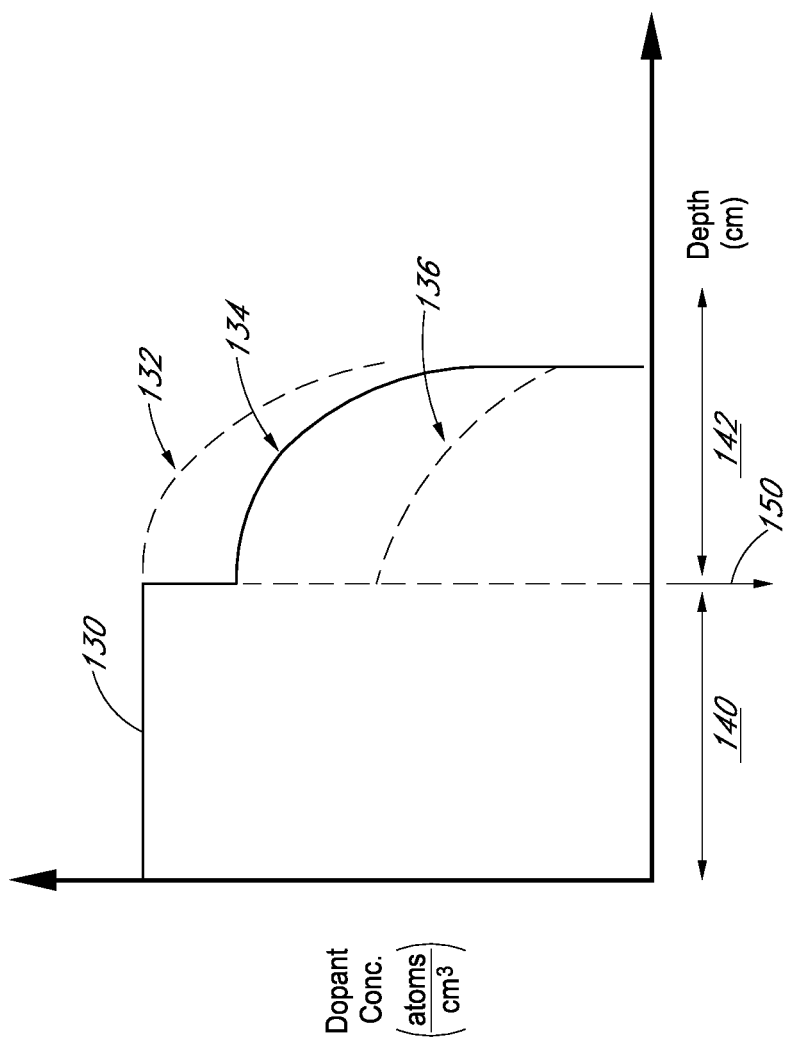
FIG. 5 illustrates a dopant diffusion diagram according to some embodiments.

With reference to FIG. 5, there is shown a dopant diffusion diagram. FIG. 5 is used to illustrate the diffusion of dopants, represented here as boron, through a semiconductor 140, a dielectric 150 and into a silicon substrate 142 of a solar cell. For example, boron can be diffused 130 into a polysilicon or amorphous silicon 140, a dielectric 150 and a silicon substrate 142.

Three examples 132, 134, 136 of dopant diffusion at the silicon substrate are shown. In a first example 132, the ratio of dopant concentration at the silicon substrate 142 and a semiconductor 140, such as polysilicon or amorphous silicon, can be 1 providing increased recombination and poor electrical conduction. In a second example 134, a ratio of the dopant concentration at the silicon substrate 142 and the semiconductor 140 can be 10 (e.g., approximately $1e^{20}$ boron concentration in a polysilicon/$1e^{19}$ boron concentration into a silicon substrate). In a third example 136, a ratio of the dopant concentration at the silicon substrate 142 and the semiconductor 140 can be greater than 10, 100, 1000 or more, providing improved results (e.g., approximately 1000 for phosphorus with a silicon dioxide tunnel dielectric resulting in decreased recombination, and improved electrical conduction). On such embodiment can include using silicon nitride as the dielectric 150 for a P-type doped polysilicon 140 over a silicon substrate. Another such embodiment can include using silicon dioxide as the dielectric 150 for an N-type doped polysilicon 140 over a silicon substrate.

Figure 6:
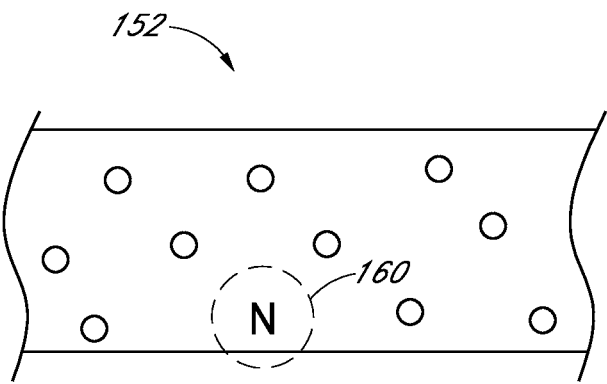
FIGS. 6-8 illustrate cross-sectional views of various example dielectrics, according to some embodiments.
Figure 7:
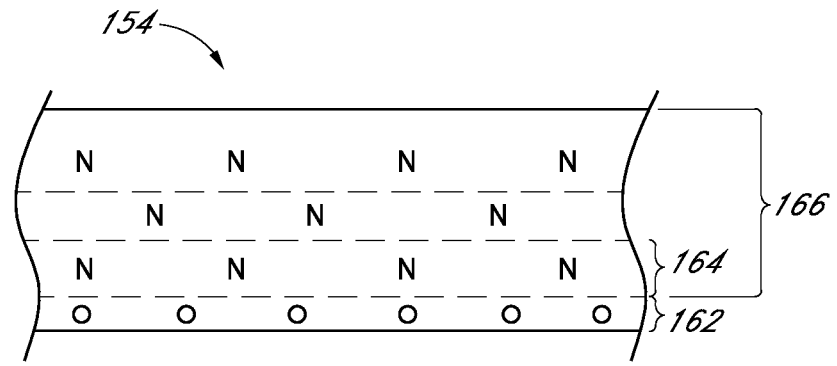
Figure 8:
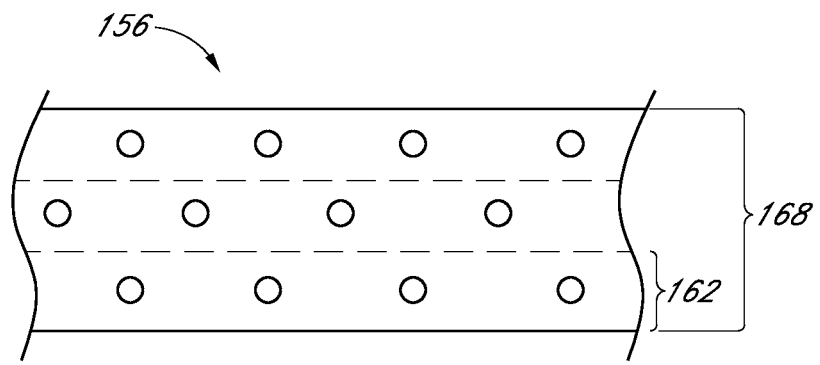

FIGS. 6-8 illustrate various embodiments for dielectrics formed in-between a doped semiconductor, such as a doped polysilicon or a doped amorphous silicon, and a silicon substrate.

With reference to FIG. 6, an example dielectric is shown. In one embodiment, the dielectric 152 can include 1-5% nitrogen 160 through dinitrogen oxide ($N_2O$) oxidation.

Turning to FIG. 7, an example dielectric formed in-between a P-type doped polysilicon and a silicon substrate is shown. The dielectric 154 shows a single oxide monolayer 162 in contact with a silicon substrate and a plurality 166 of nitride monolayers 164 disposed over the oxide monolayer 162. In an embodiment, the oxide monolayer 162 can decrease surface recombination at the dielectric interface. In an embodiment, surface recombination of the dielectric interface can be less than 1000 cm/sec. In an embodiment, the nitride monolayers 164 need not be purely formed (e.g., can have oxygen), provided the nitride monolayers 164 are formed over the oxide monolayer 162. In an embodiment, the dielectric 154 can be formed by atomic layer deposition (ALD). In an embodiment, the dielectric 154 can be silicon nitride.

FIG. 8 illustrates an example dielectric formed in-between a N-type doped polysilicon and a silicon substrate. The dielectric 156 shown discloses a plurality 168 of oxide monolayers 162.

In an embodiment, the dielectric 154 of FIG. 7 and the dielectric 156 of FIG. 8 can be used together to significantly improve the solar cell efficiency by decreasing surface recombination and increasing electrical conduction.

Figure 9:
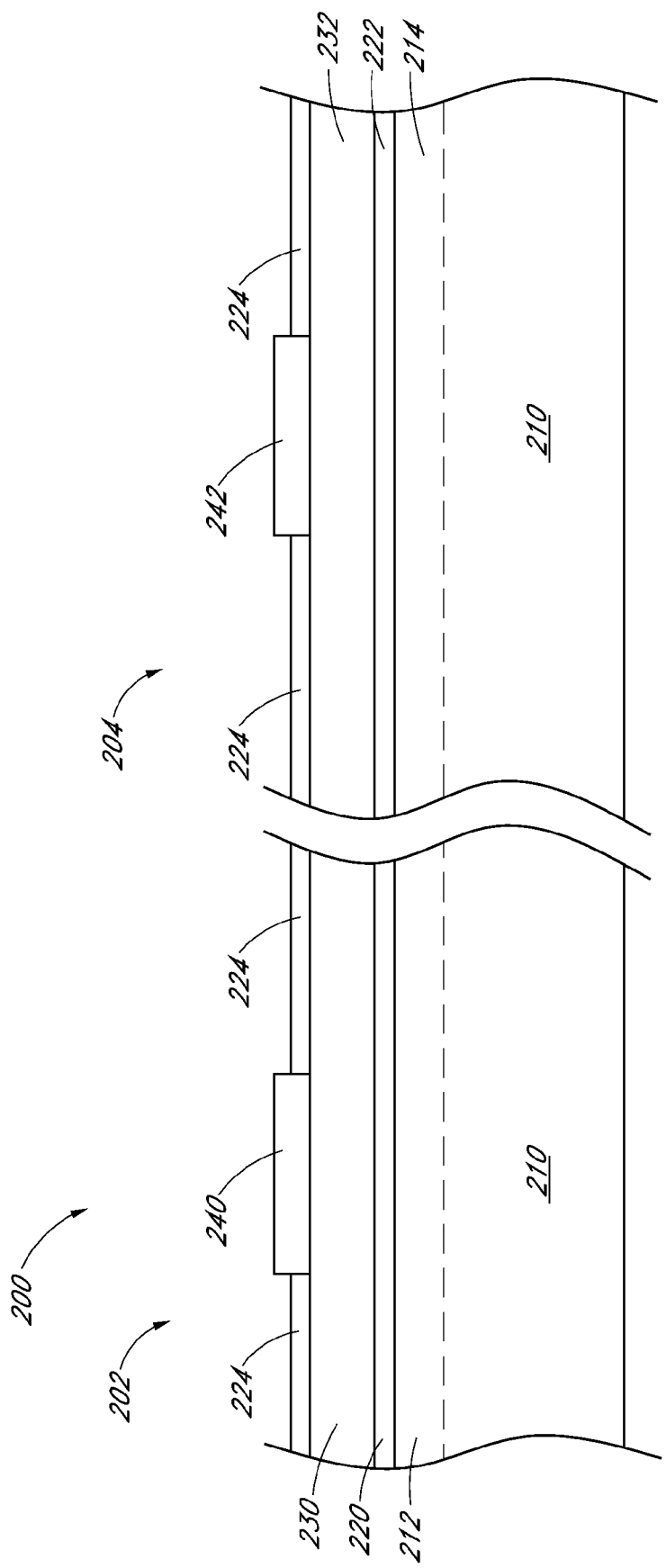
FIG. 9 illustrates a cross-sectional view of an example solar cell, according to some embodiments.

Turning to FIG. 9, a solar cell is shown. The solar cell 200 can include first contact region 202 and a second contact region 204. In an embodiment, the first contact region 202 can be a P-type contact region and the second contact region 204 can be an N-type contact region. The solar cell 200 can include a silicon substrate 210. In an embodiment, the silicon substrate 210 can be polysilicon or multi-crystalline silicon.

In an embodiment, the silicon substrate 210 can have a first doped region 212 and a second doped region 214. The silicon substrate 210 can be cleaned, polished, planarized, and/or thinned or otherwise processed prior to the formation of first and second doped regions 212, 214. The silicon substrate can be a N-type silicon substrate or a P-type silicon substrate.

A first dielectric 220 and a second dielectric 222 can be formed over the silicon substrate 210. In an embodiment, the first dielectric 220 can be formed over a first portion of the silicon substrate 210. In an embodiment, the second dielectric 222 can be formed over a second portion of silicon substrate 210. In an embodiment, the first dielectric 220 can be silicon nitride. In an embodiment, the first dielectric 220 can have an electron barrier greater than a hole barrier. In an embodiment, the first dielectric 220 can have the structure of the dielectric 154 shown in FIG. 7. In an embodiment, the second dielectric 222 can be silicon dioxide 222. In an embodiment, the second dielectric 222 can have an electron barrier less than a hole barrier. In an embodiment, the second dielectric 222 can have the structure of the dielectric 156 shown in FIG. 8.

In an embodiment, the first doped region 214 can be formed under the first dielectric 220 and the second doped region 214 can be formed under the second dielectric 222. In an embodiment, the first portion of the silicon substrate 210 can be in the same location 212 as the first doped region. In an embodiment, the second portion of the silicon substrate 210 can be in the same location 214 as the second doped region.

A first doped semiconductor 230 can be formed over the first dielectric 220. A second doped semiconductor 232 can be formed over the second dielectric 222. In an embodiment, the doped semiconductor can include doped polysilicon or a doped amorphous silicon. In some embodiments, the doped semiconductor can be a wide band gap doped semiconductor such as doped amorphous silicon. In an embodiment, the first and second doped semiconductors 230, 232 can be a first and second doped polysilicon, respectively. In an embodiment, a first doped polysilicon (e.g., 230) can be a P-type doped polysilicon. In an embodiment, a second doped polysilicon (e.g., 232) can be an N-type doped polysilicon. In an embodiment, the dopant concentration ratio between the first doped polysilicon (e.g., regions 230) and the second doped region 212 of the silicon substrate 210 can be at least 10. In an embodiment, the dopant concentration ratio between the second doped polysilicon (e.g., regions 232) and the second doped region 214 of the silicon substrate 210 can be at least 10.

In an embodiment, a third dielectric layer 224 can be formed over the first and second doped semiconductors 230, 232. The solar cell 200 can include contact openings through the third dielectric 224. In an embodiment, the contact openings can be formed by any number of lithography processes including wet-etching and ablation techniques (e.g., laser ablation, etc.). In an embodiment, the third dielectric 224 can be an anti-reflective coating (ARC) or a back anti-reflective coating (BARC) formed on either a front or back side of a solar cell. In an embodiment, the third dielectric 224 can be silicon nitride.

First and second metal contacts 240, 242 can be formed over the first and second doped semiconductors 230, 232 and through contact openings in the third dielectric 224. In an embodiment, the first metal contact 240 can be a positive-type metal contact and the second metal contact 242 can be a negative-type metal contact. In an embodiment, the first and second metal contacts 240, 242 can be, but not limited to one or more of copper, tin, aluminum, silver, gold, chromium, iron, nickel, zinc, ruthenium, palladium, and/or platinum.

As described herein, the solar cell 200 can include a first and second doped semiconductor 230, 232 such as a first and second doped polysilicon respectively. In an embodiment, the first and second doped polysilicon can be grown by a thermal process. In some embodiments, the first and second doped polysilicon can be formed by depositing dopants in the silicon substrate 210 by a conventional doping process. The first and second doped polysilicon regions and first and second doped regions 212, 214 of the silicon substrate 210 can each include a doping material but is not limited to a positive-type dopant such as boron and a negative-type dopant such as phosphorous. Although both the first and second doped polysilicon are described as being grown through a thermal process, as with any other formation, deposition, or growth process operation described or recited here, each layer or substance is formed using any appropriate process. For example, a chemical vapor deposition (CVD) process, low-pressure CVD (LPCVD), atmospheric pressure CVD (APCVD), plasma-enhanced CVD (PECVD), thermal growth, sputtering, as well as any other desired technique is used where formation is described. Thus, and similarly, the first and second doped polysilicon can be formed on the silicon substrate 210 by a deposition technique, sputter, or print process, such as inkjet printing or screen printing. Similarly, the solar cell 200 can include a first and second doped semiconductor 230, 232 such as a first and second doped amorphous silicon respectively.

The solar cell 200 can be, but not limited to, a back-contact solar cell or a front-contact solar cell.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
a first dielectric formed over a first portion of the silicon substrate;

a second dielectric formed over second portion of the silicon substrate, wherein the first dielectric is a different type of dielectric than the second dielectric;

a doped semiconductor formed over the first and second dielectric;

a positive-type metal contact formed over the doped semiconductor and the first dielectric; and a negative-type metal contact formed over the doped semiconductor and over the second dielectric.

2. The solar cell of claim 1, wherein the first dielectric comprises at least an oxide monolayer in contact with the silicon substrate.

3. The solar cell of claim 1, wherein the second dielectric comprises a plurality of oxide monolayers.

4. The solar cell of claim 1, wherein the first dielectric comprises silicon nitride.

5. The solar cell of claim 1, wherein the second dielectric comprises silicon dioxide.

6. The solar cell of claim 1, wherein the doped semiconductor comprises doped polysilicon.

7. The solar cell of claim 1, wherein the doped semiconductor comprises a P-type doped polysilicon and an N-type doped polysilicon.

8. The solar cell of claim 7, wherein the P-type doped polysilicon is formed over the first dielectric and the N-type doped polysilicon is formed over the second dielectric.

9. The solar cell of claim 8, wherein the silicon substrate comprises a first doped region under the first dielectric and a second doped region under the second dielectric.

10. The solar cell of claim 9, wherein a dopant concentration ratio between the P-type doped polysilicon and the first doped region is at least 10.

11. The solar cell of claim 1, wherein the doped semiconductor comprises doped amorphous silicon.

12. A solar cell, comprising:

a first dielectric formed over a first doped region of a silicon substrate;

a second dielectric formed over a second doped region of the silicon substrate, wherein the first dielectric is a different type of dielectric than the second dielectric;

a first doped polysilicon formed over the first dielectric;

a second doped polysilicon formed over the second dielectric;

a positive-type metal contact formed over the first doped polysilicon; and a negative-type metal contact formed over the second doped polysilicon.

13. The solar cell of claim 12, wherein the first dielectric comprises at least an oxide monolayer in contact with the silicon substrate.

14. The solar cell of claim 12, wherein the second dielectric comprises a plurality of oxide monolayers.

15. The solar cell of claim 12, wherein the first dielectric comprises silicon nitride.

16. The solar cell of claim 12, wherein the second dielectric comprises silicon dioxide.

17. The solar cell of claim 12, wherein a dopant concentration ratio between the first doped polysilicon and the first doped region is at least 10.

18. A solar cell, comprising:

silicon nitride formed over a P-type doped region of the silicon substrate;

silicon dioxide formed over an N-type doped region of the silicon substrate;

P-type doped polysilicon formed on the silicon nitride;

N-type doped polysilicon formed on the silicon dioxide;

a positive-type metal contact formed on the P-type doped polysilicon region; and a negative-type metal contact formed on the N-type doped polysilicon region.

19. The solar cell of claim 18, wherein a dopant concentration ratio between the P-type doped polysilicon and the P-type doped region is at least 10.

20. The solar cell of claim 18, wherein the silicon nitride comprises at least an oxide monolayer in contact with the silicon substrate.

* * * * *